United States Patent
Lee et al.

(10) Patent No.: US 11,277,132 B2
(45) Date of Patent: Mar. 15, 2022

(54) ELECTRONIC DEVICE INCLUDING LEVEL SHIFTER

(71) Applicant: Samsung Electronics Co., Ltd., Suwon-si (KR)

(72) Inventors: Soomin Lee, Hwaseong-si (KR); Sungjun Kim, Osan-si (KR); Hyoungjoong Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/007,046

(22) Filed: Aug. 31, 2020

(65) Prior Publication Data

US 2021/0250024 A1     Aug. 12, 2021

(30) Foreign Application Priority Data

Feb. 6, 2020 (KR) .................. 10-2020-0014522

(51) Int. Cl.
*H03K 19/003* (2006.01)
*H03K 19/00* (2006.01)
*H03K 19/0185* (2006.01)

(52) U.S. Cl.
CPC ... *H03K 19/00361* (2013.01); *H03K 19/0016* (2013.01); *H03K 19/018521* (2013.01)

(58) Field of Classification Search
CPC ..... H03K 19/00361; H03K 19/018521; H03K 19/0016
See application file for complete search history.

(56) References Cited

U.S. PATENT DOCUMENTS

| | | | |
|---|---|---|---|
| 6,043,699 A * | 3/2000 | Shimizu | H03K 3/356113 326/80 |
| 6,380,761 B1 | 4/2002 | Annema | |
| 7,199,639 B2 | 4/2007 | Kanno et al. | |
| 8,054,697 B2 | 11/2011 | Yano | |
| 9,484,897 B2 | 11/2016 | Green et al. | |
| 9,680,472 B2 | 6/2017 | Trivedi et al. | |
| 9,997,214 B1 | 6/2018 | Kumar et al. | |
| 2008/0042722 A1* | 2/2008 | Dornbusch | H03K 19/018514 327/333 |

FOREIGN PATENT DOCUMENTS

JP     3751812 B2     3/2006

OTHER PUBLICATIONS

Christian Menolfi, et al. "A 14Gb/s High-Swing Thin-Oxide Device SST TX in 45 nm CMOS SOI," Architectures & Circuits for Next Generation Wireline Transceivers/ 8.8, ISSCC, Session 8, pp. 155-157 (2011).

* cited by examiner

*Primary Examiner* — Sibin Chen
(74) *Attorney, Agent, or Firm* — Harness, Dickey & Pierce, P.L.C.

(57) ABSTRACT

Disclosed is an electronic device. The electronic device includes an input node, an output node, a power node that transfers a voltage of a third level to the output node when a voltage of the input node is a first level, and a capacitor that transfers a change in the voltage of the input node to the output node through a coupling such that a voltage of the output node is adjusted to a fourth level, when the voltage of the input node changes from the first level to a second level.

16 Claims, 9 Drawing Sheets

ELECTRONIC DEVICE INCLUDING LEVEL SHIFTER

CROSS-REFERENCE TO RELATED APPLICATIONS

This application claims priority under 35 U.S.C. § 119 to Korean Patent Application No. 10-2020-0014522 filed on Feb. 6, 2020, in the Korean Intellectual Property Office, the disclosure of which is incorporated by reference herein in its entireties.

BACKGROUND

Non-limiting example embodiments of inventive concepts described herein relate to an electronic device, and more particularly, relate to an electronic device including a level shifter having an improved speed.

An electronic device may operate using voltages having various levels, e.g. may operate using various discrete levels. For example, to reduce power consumption of the electronic device, the electronic device is designed to have a level of a first voltage used in the electronic device low. Additionally or alternatively, the electronic device may be designed in compliance with a signal transmission protocol such that a level of a second voltage used for the electronic device to communicate with an external device is higher than the level of the first voltage.

Circuits that use the first voltage may belong to a first voltage domain. Circuits that use the second voltage may belong to a second voltage domain. When signals are exchanged between different voltage domains, a level shifter that is configured to change a level of a signal may be used. For example, the electronic device may include a level shifter and may operate using the level shifter.

As an operating speed of the electronic device is improved, an operating speed of the level shifter causes a decrease in the operating speed of the electronic device. Accordingly, there is required/desired a level shifter having an improved operating speed.

SUMMARY

Embodiments of inventive concepts provide an electronic device including a level shifter having an improved operating speed.

According to some example embodiments, an electronic device includes an input node, an output node, a power node configured to pass a voltage at a third level to the output node in response to a voltage of the input node being at first level, and a capacitor configured to adjust the voltage of the output node to a fourth level by coupling in response to the voltage of the input node changing from the first level to a second level.

According to some example embodiments, an electronic device includes a first driver configured to output a first signal toggling between a first power supply voltage and a ground voltage, a second driver configured to output a second signal toggling between a second power supply voltage and the ground voltage, and a level shifter configured to receive the first signal, to convert the first signal into a third signal toggling between a first voltage and the second power supply voltage, and to output the third signal to the second driver. The level shifter is configured to, output the second power supply voltage as the third signal in response to the first signal being the first power supply voltage, and adjust the third signal to the first voltage through a coupling in response to a change in the first signal from the first power supply voltage to the ground voltage.

According to some example embodiments, an electronic device includes an internal circuit, a pad configured to be connected with an external device, and a transmitter configured to output a first signal to the external device through the pad, the first signal transferred from the internal circuit. The transmitter includes, a first driver configured to receive the first signal and to output a second signal toggling between a first power supply voltage and a ground voltage, the toggling being in response to the first signal, a second driver configured to output a third signal toggling between a second power supply voltage and the ground voltage, and a level shifter configured to receive the second signal, to convert the second signal into a fourth signal toggling between a first voltage and the second power supply voltage, and to output the fourth signal to the second driver. The level shifter is configured to, output the second power supply voltage as the fourth signal in response to the second signal being the first power supply voltage, and, adjust the fourth signal to the first voltage by transferring a change of the second signal through a coupling, the adjusting being in response to the second signal changing from the first power supply voltage to the ground voltage.

BRIEF DESCRIPTION OF THE FIGURES

The above and other objects and features of inventive concepts will become apparent by describing in detail example embodiments thereof with reference to the accompanying drawings.

DETAILED DESCRIPTION OF EXAMPLE EMBODIMENTS

Below, some example embodiments of inventive concepts may be described in detail and clearly to such an extent that an ordinary one in the art easily implements inventive concepts.

Figure 1:
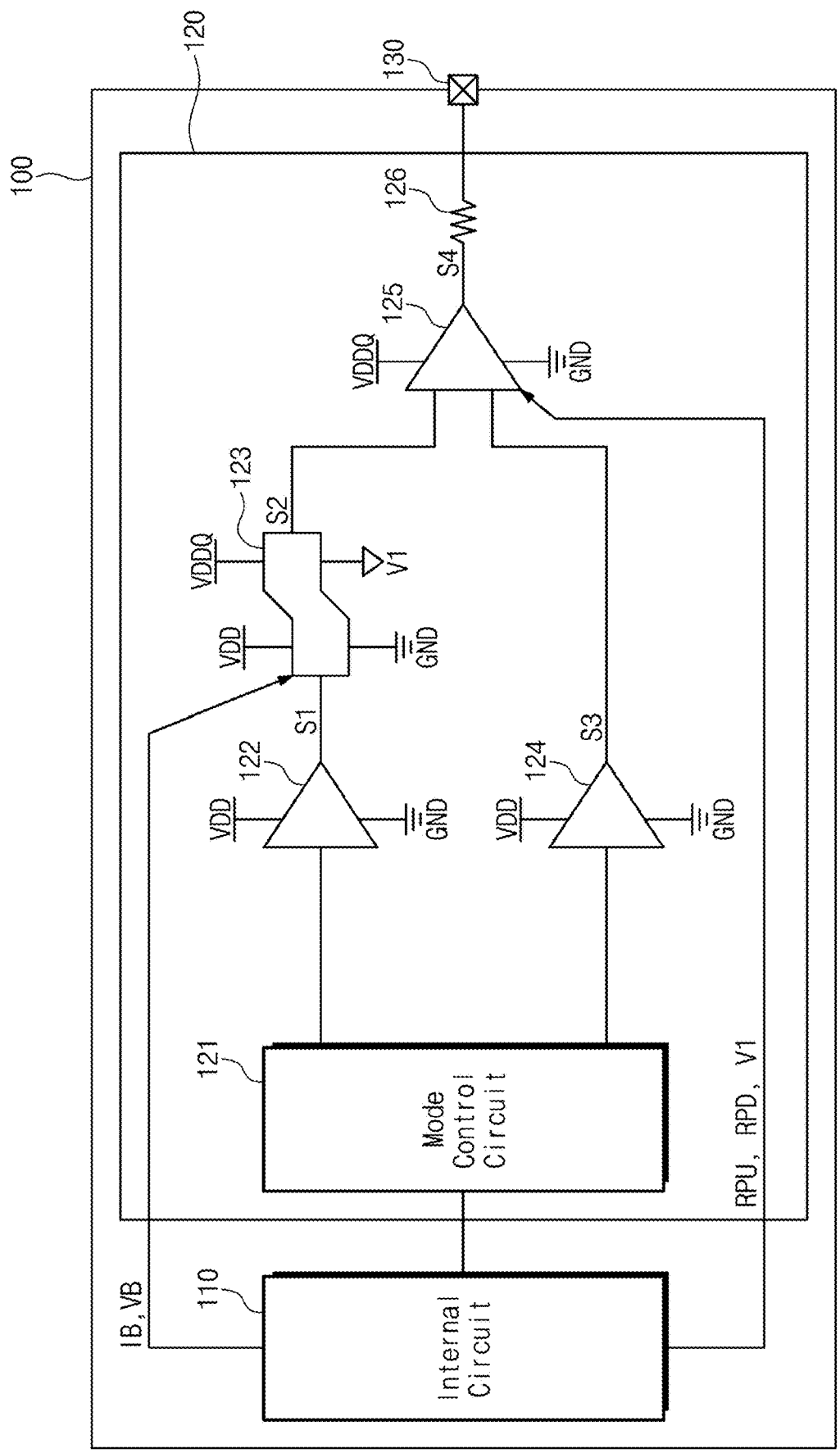
FIG. 1 illustrates an electronic device according to some example embodiments of inventive concepts.

FIG. 1 illustrates an electronic device 100 according to some example embodiments of inventive concepts. Referring to FIG. 1, the electronic device 100 may include internal circuitry/an internal circuit 110, a transmitter 120, and a pad 130.

The internal circuit 110 may output a signal to an external device (not shown) through the pad 130 by using the transmitter 120. The internal circuit 110 may be configured to perform various operations designed/intended in manufacturing and operation of the electronic device 100.

The internal circuit 110 may provide the transmitter 120 with a current code IB and/or a bias voltage VB for controlling the transmitter 120. Additionally or alternatively, the internal circuit 110 may provide the transmitter 120 with a pull-up resistance code RPU, a pull-down resistance code RPD, and/or a first voltage V1 for controlling the transmitter 120.

The transmitter 120 may operate under control of the internal circuit 110 and may output a signal provided from the internal circuit 110 to the external device through the pad 130. The transmitter 120 may include mode control circuitry/a mode control circuit 121, a first driver 122, a level shifter 123, a second driver 124, a third driver 125, and a resistor 126.

The mode control circuit 121 may operate under control of the internal circuit 110. The mode control circuit 121 may control the transmitter 120, in detail, the third driver 125 in one of a first mode to output a toggle signal, a second mode to provide an on-die termination, or a third mode of a high-impedance/high-Z state.

In the first mode, the mode control circuit 121 may provide a signal received from the internal circuit 110 to each of the first driver 122 and the second driver 124. Signals respectively provided to the first driver 122 and the second driver 124 in the first mode may be the same signals and may toggle between a first power supply voltage VDD and a ground voltage GND.

The first driver 122 may be biased by/powered by the first power supply voltage VDD and the ground voltage GND. The first driver 122 may output a first signal S1 toggling between the first power supply voltage VDD and the ground voltage GND, in response to an output signal of the mode control circuit 121. For example, the first power supply voltage VDD may be 0.9 V/about 0.9 V.

The level shifter 123 may be biased by/powered by the first power supply voltage VDD, a second power supply voltage VDDQ, the ground voltage GND, and the first voltage V1. The level shifter 123 may receive the current code IB and/or the bias voltage VB from the internal circuit 110. The level shifter 123 may receive the first signal S1 toggling between the first power supply voltage VDD and the ground voltage GND.

The level shifter 123 may convert the first signal S1 into a second signal S2 toggling between the second power supply voltage VDDQ and the first voltage V1, by using the current code IB and the bias voltage VB. The first voltage V1 may be higher than/greater than the ground voltage GND. The second power supply voltage VDDQ may be higher than/greater than the first power supply voltage VDD and may be, for example, 1.35 V or about 1.35 V.

The second driver 124 may be biased by/powered by the first power supply voltage VDD and the ground voltage GND. The second driver 124 may output a third signal S3 toggling between the first power supply voltage VDD and the ground voltage GND, e.g. in response to an output signal of the mode control circuit 121.

The third driver 125 may be biased by the second power supply voltage VDDQ and the ground voltage GND. The third driver 125 may receive the pull-up resistance code RPU, the pull-down resistance code RPD, and the first voltage V1 from the internal circuit 110. The third driver 125 may receive the second signal S2 from the level shifter 123 and may receive the third signal S3 from the second driver 124.

The third driver 125 may output a fourth signal S4 toggling between the second power supply voltage VDDQ and the ground voltage GND, in response to at least one of the pull-up resistance code RPU, the pull-down resistance code RPD, the first voltage V1, the second signal S2, or the third signal S3. The fourth signal S4 may be transferred to the pad 130 through the resistor 126.

A level of the first power supply voltage VDD may be lower than/less than a level of the second power supply voltage VDDQ. The internal circuit 110 may operate by using the first power supply voltage VDD. Operating using the first power supply voltage VDD may reduce power consumption. Additionally, the electronic device 100 may communicate with the external device by using the second power supply voltage VDDQ, for example, in compliance with the signal transmission protocol. The transmitter 120 may convert a signal in a first voltage domain based on the first power supply voltage VDD into a signal in a second voltage domain based on the second power supply voltage VDDQ.

Each of the first driver 122 and the second driver 124 may be or include a pre-driver belonging to the first voltage domain. The third driver 125 may be a main driver for signal transmission, e.g. signal transmission to the external device. In some example embodiments, additional drivers may be provided in front of the first driver 122 and/or in back of the first driver 122, and/or in front of the second driver 124 and/or in back of the second driver 124.

Figure 2:
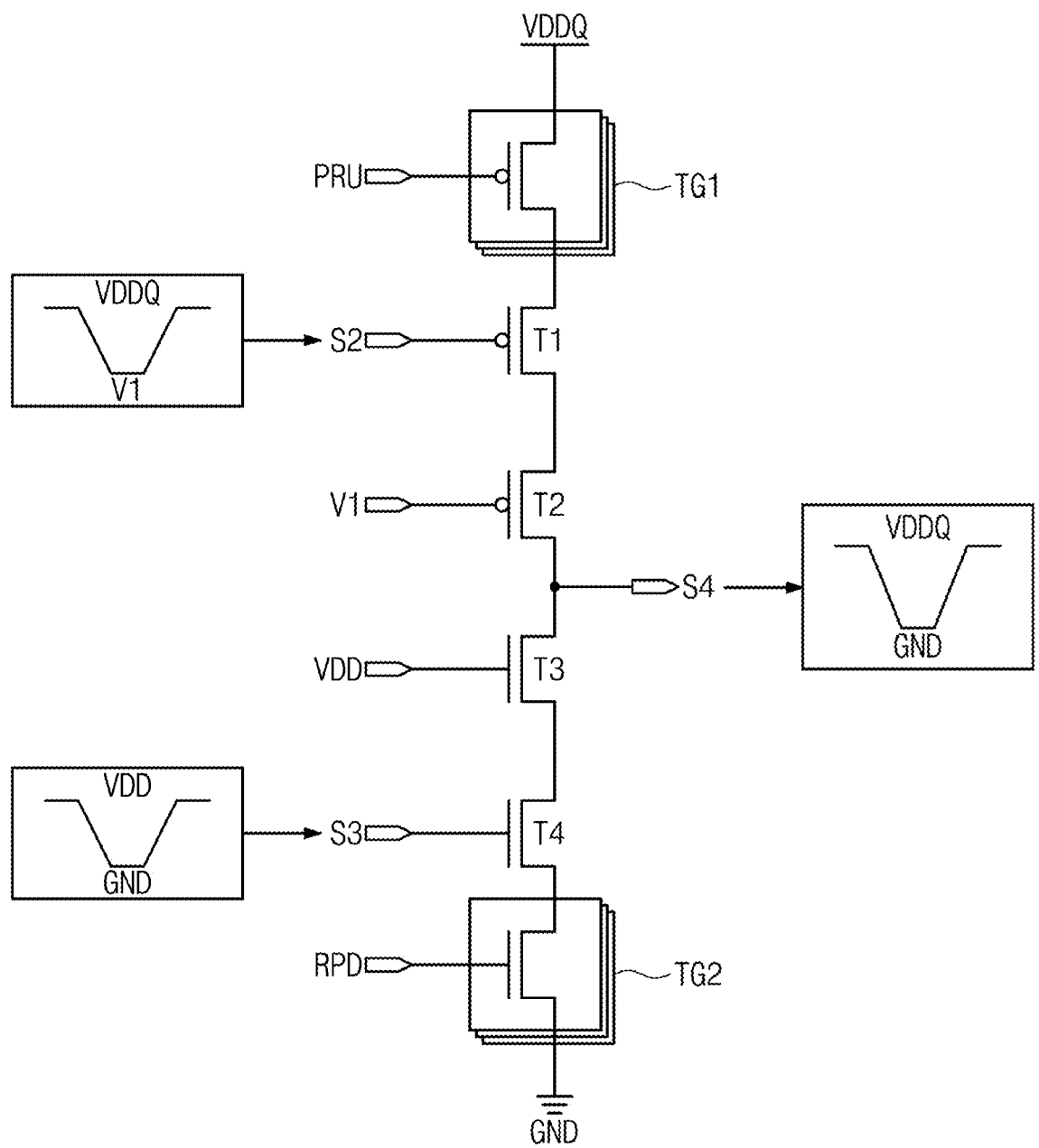
FIG. 2 illustrates a third driver according to some example embodiments of inventive concepts.

FIG. 2 illustrates a schematic of the third driver 125 according to some example embodiments of inventive concepts. Referring to FIGS. 1 and 2, the third driver 125 may include first to fourth transistors T1 to T4, and first and second transistor groups TG1 and TG2. The first transistor T1 and the second transistor T2 may be PMOS transistors; the third transistor T3 and the fourth transistor T4 may be NMOS transistors; the first transistor group TG1 may include PMOS transistors; and the second transistor group TG2 may include NMOS transistors; however, example embodiments are not limited thereto.

A node, e.g. a common node, between the second transistor T2 and the third transistor T3 may be/correspond to an output node from which the fourth signal S4 is output. The fourth signal S4 may toggle between the second power supply voltage VDDQ and the ground voltage GND.

The first transistor group TG1, the first transistor T1, and the second transistor T2 may be connected in series between a node to which the second power supply voltage VDDQ is supplied and the output node from which the fourth signal S4 is output.

The first transistor group TG1 may operate in response to the pull-up resistance code RPU. The first transistor group TG1 may include a plurality of transistors connected in parallel. The pull-up resistance code RPU may adjust the number of transistors, which are to be turned on (or turned off), from among the transistors of the first transistor group TG1.

The first transistor group TG1 may provide impedance matching. For example, the first transistor group TG1 may adjust a resistance value between the output node and the node to which the second power supply voltage VDDQ is supplied. The adjustment may be such that a sum with a resistance value of the resistor 126 is equal to a specific resistance value (e.g., a value necessary/used for an operation of the third driver 125).

The second signal S2 toggling between the second power supply voltage VDDQ and the ground voltage GND may be transferred to a gate of the first transistor T1. The first voltage V1 may be transferred to a gate of the second transistor T2. In some example embodiments, a level of the first voltage V1 output from the level shifter 123 may be stored in a voltage storage element such as a capacitor, and the stored voltage may be applied to a gate of the second transistor T2.

The third transistor T3, the fourth transistor T4, and the second transistor group TG2 may be connected in series between the output node and another node to which the ground voltage GND is supplied. The first power supply voltage VDD may be transferred to a gate of the third transistor T3. The third signal S3 toggling between the first power supply voltage VDD and the ground voltage GND may be transferred to a gate of the fourth transistor T4.

The second transistor group TG2 may provide impedance matching. For example, the second transistor group TG2 may adjust a resistance value between the output node and the node to which the ground voltage GND is supplied. The adjustment may be such that a sum with the resistance value of the resistor 126 is equal to the specific resistance value (e.g., the value necessary/used for an operation of the third driver 125).

The transistors of the third driver 125, for example, the first to fourth transistors T1 to T4 and the transistors of the first and second transistor groups TG1 and TG2 may be thin-oxide transistors. For example, the first to fourth transistors T1 to T4 and the transistors of the first and second transistor groups TG1 and TG2 may tolerate the first power supply voltage VDD but may be broken down by the second power supply voltage VDDQ. An oxide thickness of the thin-oxide transistors may be about 1.5-4 nm (15-40 Angstroms), e.g. about 25 Angstroms.

Accordingly, at least two transistors may be interposed between the output node and the node to which the second power supply voltage VDDQ is supplied, and at least two transistors may be interposed between the output node and the node to which the ground voltage GND is supplied, such that a voltage difference greater than the first power supply voltage VDD does not occur at each of the first to fourth transistors T1 to T4 and the transistors of the first and second transistor groups TG1 and TG2.

Additionally or alternatively, the first voltage V1 and the first power supply voltage VDD may be respectively biased to the gate of the second transistor T2 and the gate of the third transistor T3, such that a voltage difference greater than the first power supply voltage VDD does not occur at each of the first to fourth transistors T1 to T4 and the transistors of the first and second transistor groups TG1 and TG2.

A level of the first voltage V1 may be lower than/less than a level of the first power supply voltage VDD, and may be higher than/greater than a level of the ground voltage GND. The first voltage V1 may have a level that is close to a value corresponding to a difference between the second power supply voltage VDDQ and the first power supply voltage VDD.

Parasitic capacitances of thin-oxide transistors may be smaller than parasitic capacitances of thick-oxide transistors. Accordingly, in the case where the third driver 125 is implemented with thin-oxide transistors, an operating speed of the third driver 125 may be improved. A thick-oxide transistor may have an oxide thickness of about 4.5 nm or greater, e.g. about 5 nm or about 6 nm (50 Angstroms to 60 Angstroms).

Because the first transistor T1, the second transistor T2, and the transistors of the first transistor group TG1 may be thin-oxide transistors, the first transistor T1, the second transistor T2, and the transistors of the first transistor group TG1 may have threshold voltages higher than (greater than) a ground voltage. For example, each of the first transistor T1, the second transistor T2, and the transistors of the first transistor group TG1 may be turned on even when a voltage difference between the gate and the source is a positive level of the first power supply voltage VDD or lower.

Figure 3:
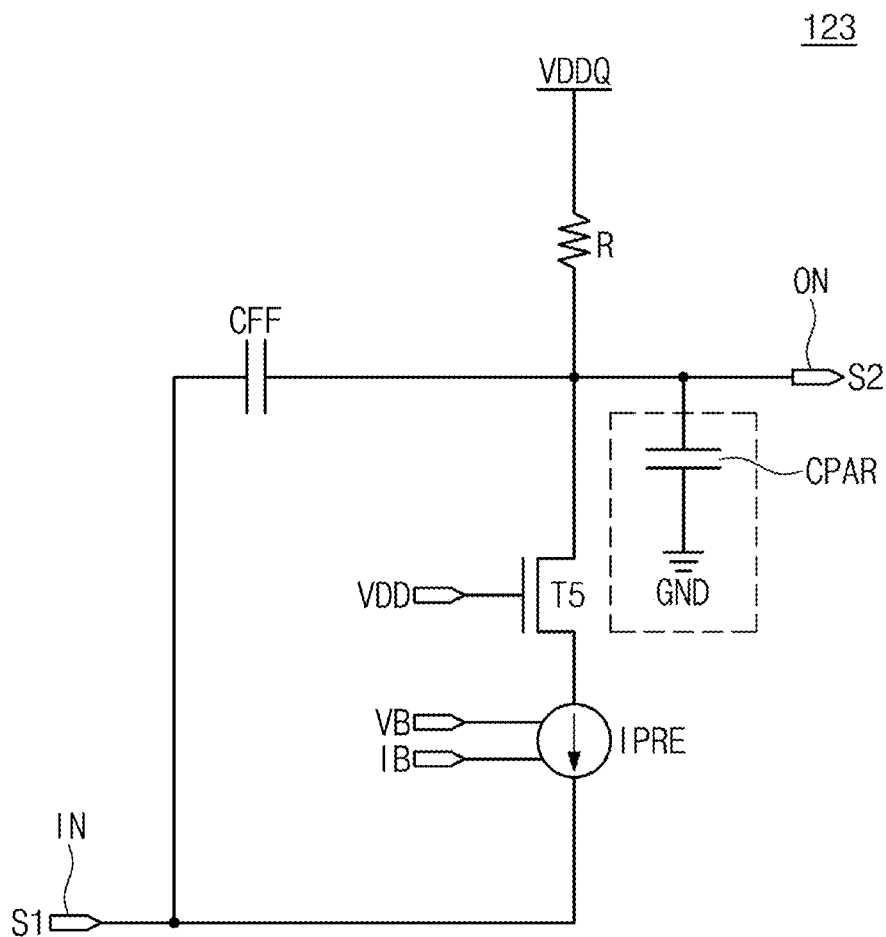
FIG. 3 illustrates a level shifter according to some example embodiments of inventive concepts.

FIG. 3 illustrates the level shifter 123 according to some example embodiments of inventive concepts. Referring to FIGS. 1, 2, and 3, the level shifter 123 may include an input node IN, an output node ON, a resistor "R", a fifth transistor T5, a current source IPRE, and a capacitor CFF.

The resistor "R" may be connected between/directly connected between the node to which the second power supply voltage VDDQ is supplied and the output node ON. The fifth transistor T5 may be connected between/directly connected between the output node ON and the current source IPRE. The capacitor CFF may be connected between/directly connected between the input node IN and the output node ON. The fifth transistor T5 may be an NMOS transistor; however, example embodiments are not limited thereto.

The current source IPRE may be connected between/directly connected between the fifth transistor T5 and the input node IN. The current source IPRE may receive the bias voltage VB and the current code IB. The current source IPRE may generate a current in response to the bias voltage VB and may adjust a current amount in response to the current code IB.

In some example embodiments, a parasitic capacitance of the level shifter 123 may be modeled and/or expressed by a parasitic capacitor CPAR. The resistor "R" may be implemented by using various elements having a resistance, such as a resistor, a transistor, and/or a diode.

Figure 4:
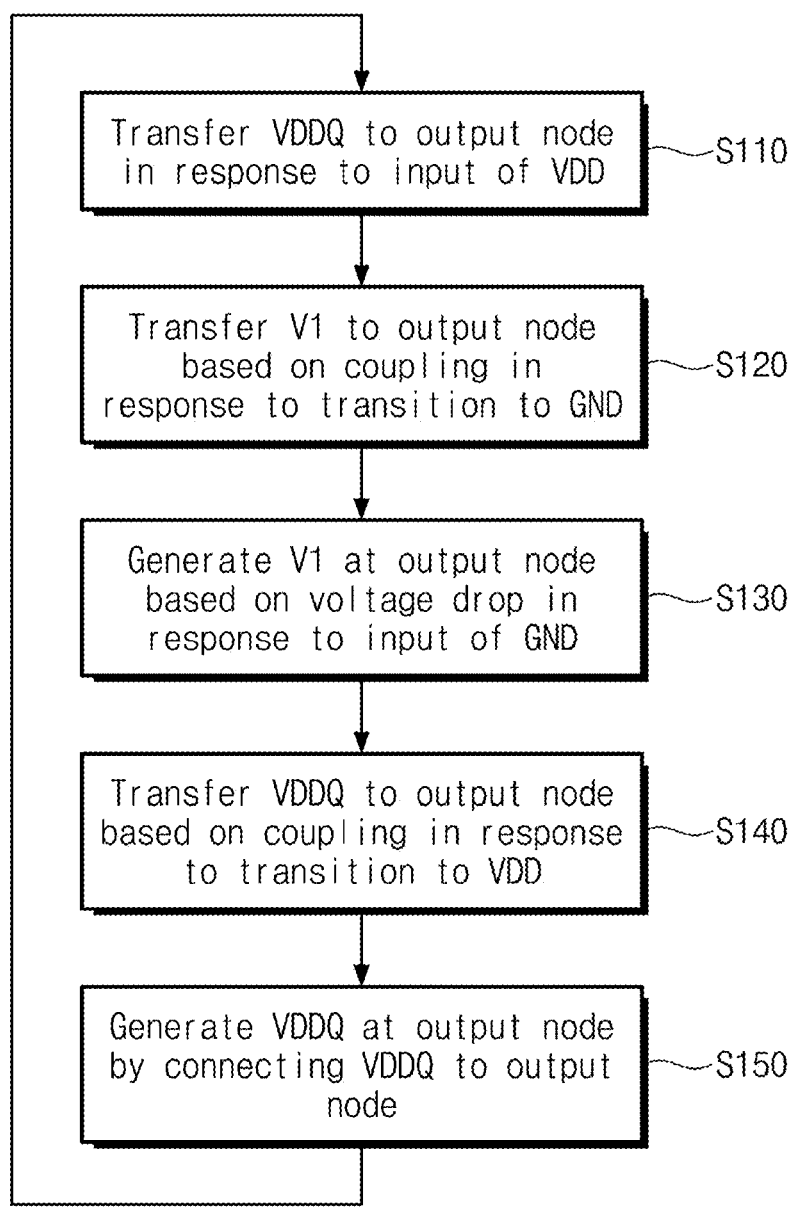
FIG. 4 illustrates an example of an operating method of a level shifter, according to some example embodiments.

FIG. 4 illustrates an example of an operating method of the level shifter 123. Referring to FIGS. 3 and 4, in operation S110, the level shifter 123 may transfer the second power supply voltage VDDQ to the output node ON in response to an input of the first power supply voltage VDD corresponding to the first signal S1.

In operation S120, the level shifter 123 may transfer the first voltage V1 to the output node ON based on coupling, in response to a transition of the first signal S1 to the ground voltage GND. In operation S130, the level shifter 123 may generate the first voltage V1 at the output node ON based on a voltage drop, in response to an input of the ground voltage GND as the first signal S1.

For example, when the first signal S1 transitions from the first power supply voltage VDD to the ground voltage GND, the level shifter 123 may transfer the first voltage V1 to the output node ON based on the coupling and the voltage drop. The coupling may occur by/with the capacitor CFF. For example, the capacitor CFF may be or include a feedforward capacitor. The voltage drop may occur by the resistor "R" and the current source IPRE.

In operation S140, the level shifter 123 may transfer the first voltage V1 to the output node ON based on the coupling, in response to a transition of the first signal S1 from the ground voltage GND to the first power supply voltage VDD. In operation S150, the level shifter 123 may generate the second power supply voltage VDDQ at the output node ON by connecting the second power supply voltage VDDQ with the output node ON in response to an input of the first power supply voltage VDD, corresponding to the first signal S1.

Figure 5:
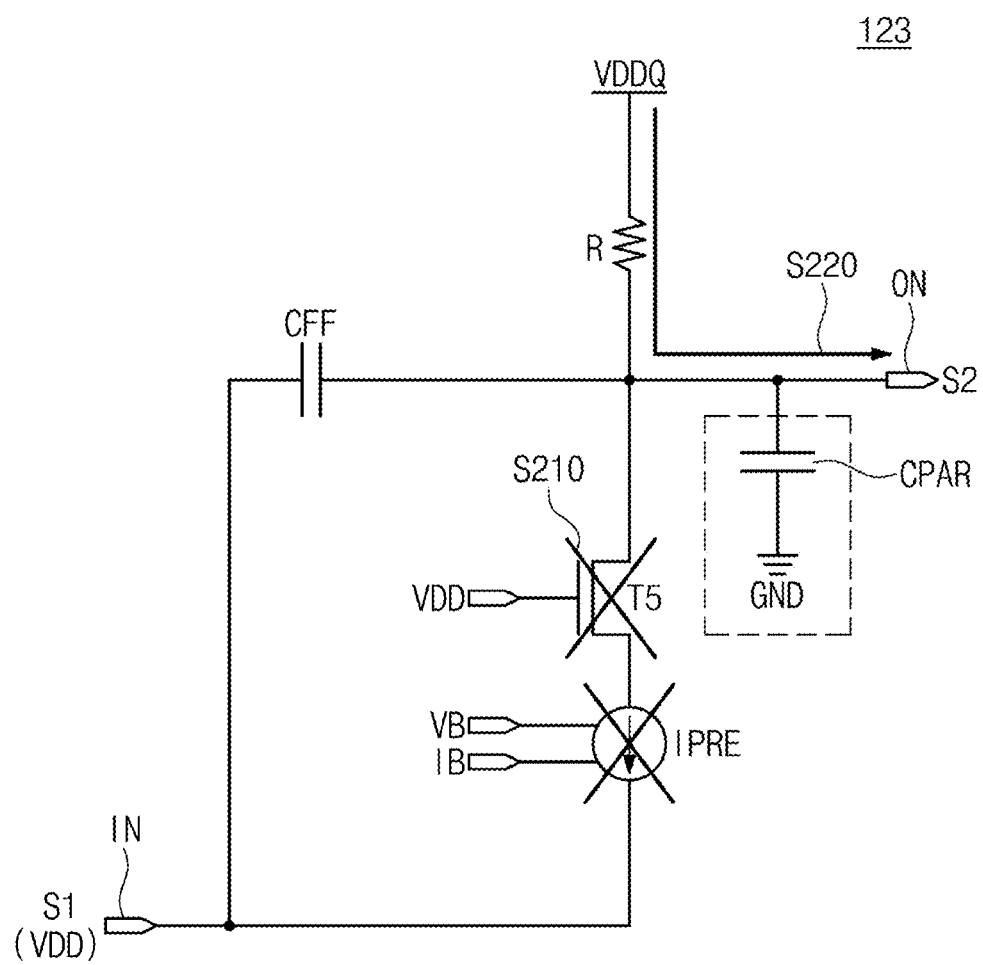
FIG. 5 illustrates an example of an operation of a level shifter when a power supply voltage is input as a first signal, according to some example embodiments.

FIG. 5 illustrates an example of an operation of the level shifter 123 when the first power supply voltage VDD is input as the first signal S1. Referring to FIG. 5, when the first signal S1 changes from the ground voltage GND to the first power supply voltage VDD, the capacitor CFF may transfer the voltage change of the first signal S1 as the second signal S2 based on the coupling. Accordingly, a level of the second signal S2 may quickly rise.

Also, when the first power supply voltage VDD is input as the first signal S1, the fifth transistor T5 and the current source IPRE are turned off (refer to path S210). Accordingly, the second power supply voltage VDDQ may be transferred to the output node ON through the resistor "R" for example by path S220, and a final level of the second signal S2 may be/correspond to the second power supply voltage VDDQ.

Figure 6:
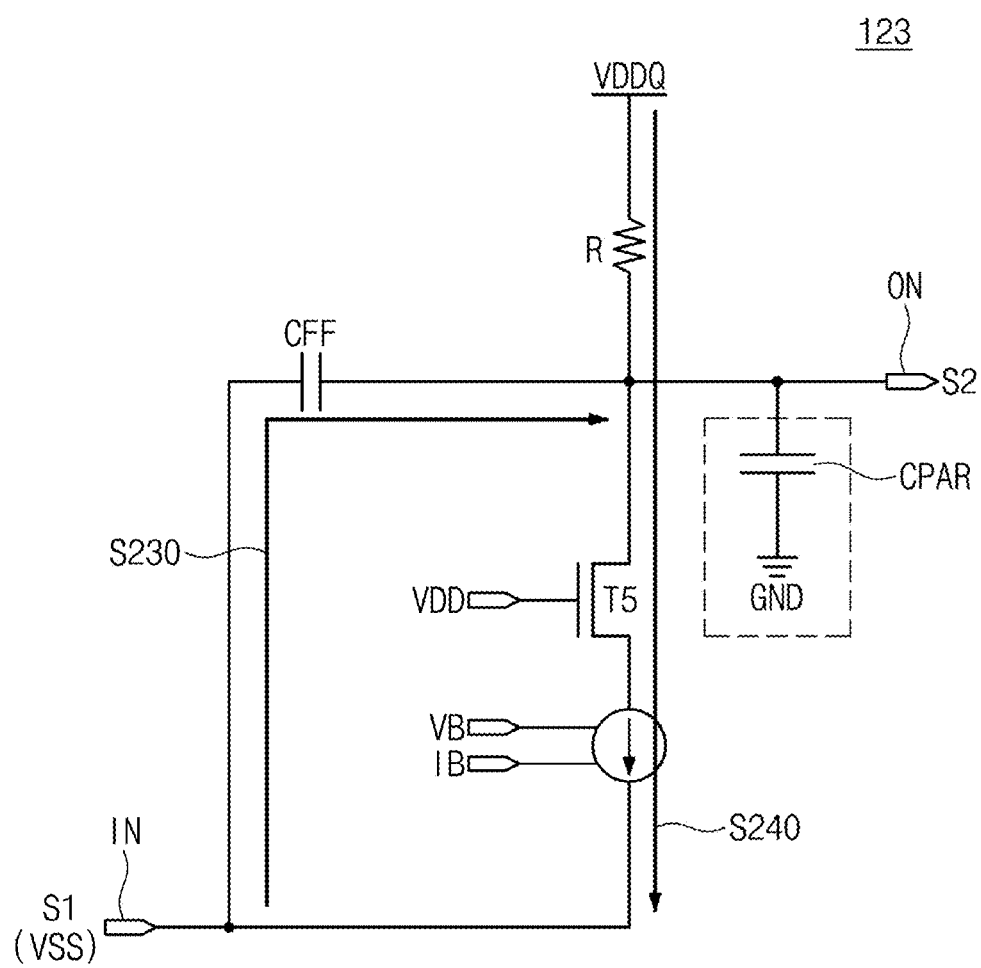
FIG. 6 illustrates an example of an operation of a level shifter when a first signal transitions from a first power supply voltage to a ground voltage, according to some example embodiments.

FIG. 6 illustrates an example of an operation of the level shifter 123 when the first signal S1 transitions from the first power supply voltage VDD to the ground voltage GND. Referring to FIG. 6, when a voltage of the first signal S1 is the ground voltage GND, the fifth transistor T5 is turned on. Accordingly, a current may flow through the current source IPRE. The fifth transistor T5 and the current source IPRE may operate as a common-gate amplifier.

As a current flows through the current source IPRE, a voltage of the output node ON may decrease. A final voltage of the output node ON may be a voltage that is obtained by subtracting a voltage dropped by current though the resistor "R" and the current source IPRE from the second power supply voltage VDDQ, e.g. along path S240. A voltage that is generated at the output node ON by the resistor "R" and the current source IPRE may be expressed by Equation 1 below.

$$S2 = VDDQ - IPRE \cdot R \quad \text{[Equation 1]}$$

In Equation 1 above, "IPRE" may be the amount of current that flows through the current source IPRE.

The adjustment of the voltage of the output node ON by using the current source IPRE requires/uses a specific time. The specific time may act as a factor that hinders the level shifter 123 from operating at a high speed.

The level shifter 123 according to some example embodiments of inventive concepts may further include the capacitor CFF. The capacitor CFF may transfer a change of the first signal S1 to the output node ON through the coupling, e.g. along path S230. An amount by which the change of the first signal S is transferred to the output node ON may be determined by the capacitor CFF and the parasitic capacitor CPAR and may be expressed by Equation 2 below.

$$\Delta V = \frac{CFF}{CFF + CPAR} \cdot VDD \quad \text{[Equation 2]}$$

When a final level of the voltage change transferred to the output node ON by the capacitor CFF and a final level of the voltage generated at the output node ON by the voltage drop of the resistor "R" are matched with the first voltage V1, the level shifter 123 may make the second signal S2 to transition quickly (from the second power supply voltage VDDQ to the first voltage V1), in response to the transition of the first signal S1 (from the first power supply voltage VDD to the ground voltage GND).

Accordingly, a transient response may be shortened by the capacitor CFF. A steady state response may be determined by the voltage drop of the resistor "R". A level of the first voltage V1 may be expressed by Equation 3 below.

$$V1 = VDDQ - \frac{CFF}{CFF + CPAR} \cdot VDD \quad \text{[Equation 3]}$$

When a capacitance of the capacitor CFF is, for example, ten times a capacitance of the parasitic CPAR, the first voltage V1 may be approximately "VDDQ—0.9 VDD". As the capacitance of the capacitor CFF becomes greater than the capacitance of the parasitic capacitor CPAR, the first voltage V1 may have a level closer to a difference value between the second power supply voltage VDDQ and the first power supply voltage VDD.

Figure 7:
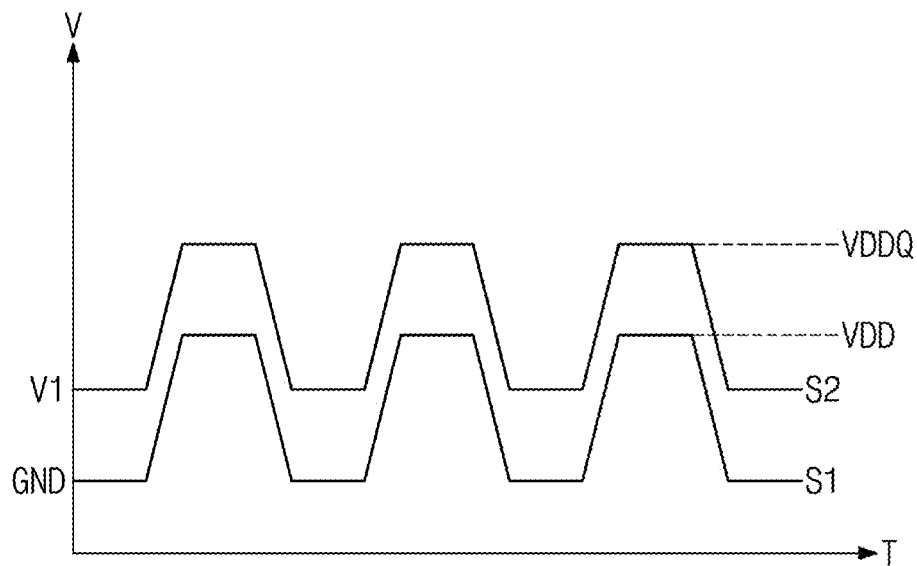
FIG. 7 illustrates an example of comparing a first signal and a second signal, according to some example embodiments.

FIG. 7 illustrates an example of comparing the first signal S1 and the second signal S2. In FIG. 7, a horizontal axis represents a time "T", and a vertical axis represents a voltage "V". Referring to FIGS. 3 and 7, the first signal S1 may toggle between the first power supply voltage VDD and the ground voltage GND.

The second signal S2 may toggle between the second power supply voltage VDDQ and the first voltage V1. The first voltage V1 may be lower than/less than the first power supply voltage VDD and may be higher than the ground voltage GND. The first voltage V1 may be closer in level to the first power supply voltage VDD than the ground voltage GND.

Figure 8:
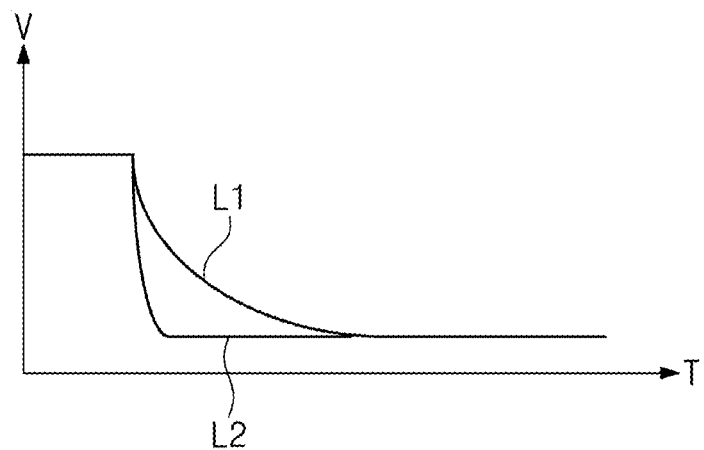
FIG. 8 illustrates an example in which a waveform of a second signal varies depending on whether a capacitor exists, according to some example embodiments.

FIG. 8 illustrates an example in which a waveform of the second signal S2 varies depending on whether the capacitor CFF exists. In FIG. 8, a horizontal axis represents a time "T", and a vertical axis represents a voltage "V". A first line L1 shows a waveform of the second signal S2 when the capacitor CFF does not exist. A second line L2 shows a waveform of the second signal S2 when the capacitor CFF exists.

As illustrated in FIG. 8, an operating speed of the level shifter 123 may be improved by reducing a transient response time of the second signal S2 by using the capacitor CFF. For example, a change speed of the second signal S2 may be accelerated to such an extent as to be similar to a change speed of the third signal S3.

Additionally, when the first signal S1 changes from the ground voltage GND to the first power supply voltage VDD, the capacitor CFF may accelerate the change of the second signal S2 by transferring the change of the first signal S1 to the output node ON.

Figure 9:
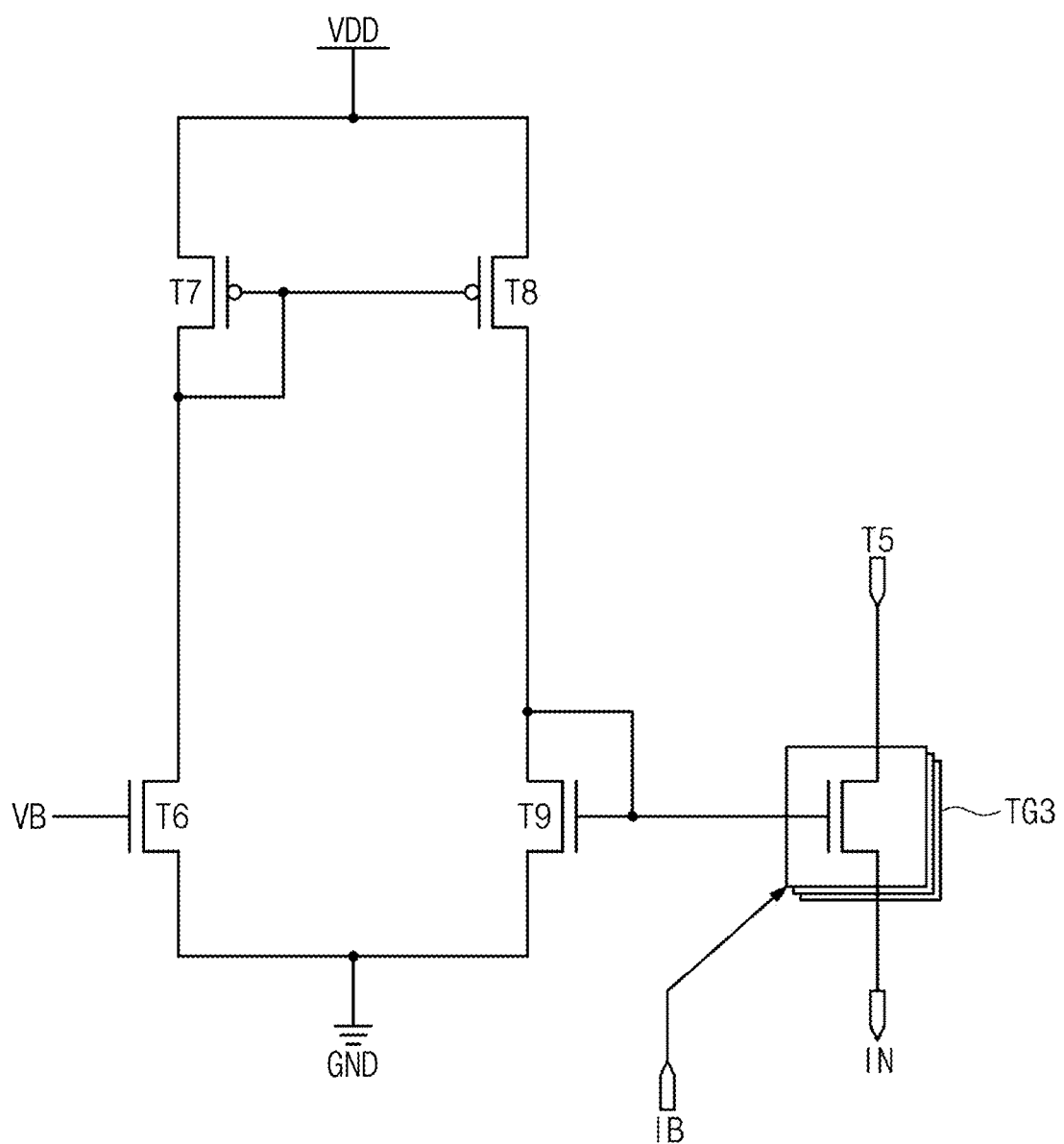
FIG. 9 illustrates an example of a current source according to some example embodiments.

FIG. 9 illustrates an example of the current source IPRE. Referring to FIGS. 3 and 9, the current source IPRE may include sixth to ninth transistors T6 to T9, and a third transistor group TG3.

The sixth transistor T6 is connected between/directly connected between the seventh transistor T7 and the node to which the ground voltage GND is supplied. The bias voltage VB is applied to a gate of the sixth transistor T6. The sixth transistor T6 may drain a current corresponding to the bias voltage VB.

The seventh transistor T7 is connected between/directly connected between the node supplied with the first power supply voltage VDD and the sixth transistor T6. A gate of the seventh transistor T7 may be connected with a node between the sixth and seventh transistors T6 and T7. The seventh transistor T7 may generate a voltage corresponding to the current flowing through the sixth transistor T6 at a gate thereof.

The eighth transistor T8 may be connected between/directly connected between the node supplied with the first power supply voltage VDD and the ninth transistor T9. A gate of the eighth transistor T8 is connected with the gate of the seventh transistor T7. The eighth transistor T8 may drain a current corresponding to a voltage of the gate of the seventh transistor T7.

The ninth transistor T9 may be connected between/directly connected between the eighth transistor T8 and the node supplied with the ground voltage GND. A gate of the ninth transistor T9 may be connected with a node between the eighth and ninth transistors T8 and T9. The ninth transistor T9 may generate a voltage corresponding to the current flowing through the eighth transistor T8 at a gate thereof.

The third transistor group TG3 may include a plurality of transistors connected in parallel. The third transistor group TG3 may be connected between/directly connected between the fifth transistor T5 and the input node IN. Gates of the transistors in the third transistor group TG3 may be connected with the gate of the ninth transistor T9.

The current code IB may adjust the number of transistors, which are to be activated/or deactivated, from among the transistors of the third transistor group TG3. For example, switches may be provided between the gates of the transistors in the third transistor group TG3 and the gate of the ninth transistor T9, and the current code IB may activate the transistors by turning on the respective switches and may deactivate the transistors by turning off the respective switches.

Figure 10:
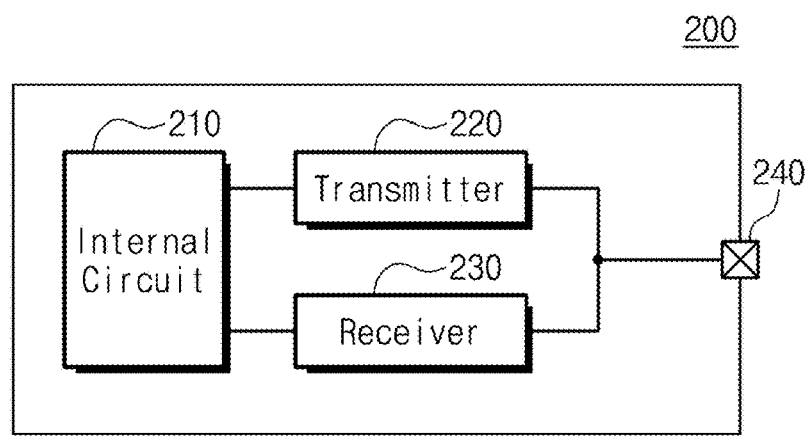
FIG. 10 illustrates an electronic device according to some example embodiments of inventive concepts.

FIG. 10 illustrates an electronic device 200 according to an additional embodiment of inventive concepts. Referring to FIG. 10, the electronic device 200 may include an internal circuit 210, a transmitter 220, a receiver 230, and a pad 240.

The internal circuit 210 may be configured to perform various operations intended in/used for/designed for operation and/or manufacturing. For example, as described with reference to FIG. 1, the internal circuit 210 may provide the transmitter 220 with the current code IB and the bias voltage VB for controlling the transmitter 220. Also, the internal circuit 210 may provide the transmitter 220 with the pull-up resistance code RPU, the pull-down resistance code RPD, and the first voltage V1 for controlling the transmitter 220.

The transmitter 220 may output a signal to an external device through the pad 240 under control of the internal circuit 210. The transmitter 220 may include the transmitter 120 described with reference to FIG. 1.

The receiver 230 may transfer a signal received from the external device through the pad 240 to the internal circuit 210. As illustrated in FIG. 10, the transmitter 220 and the receiver 230 may be configured to share the pad 240.

Figure 11:
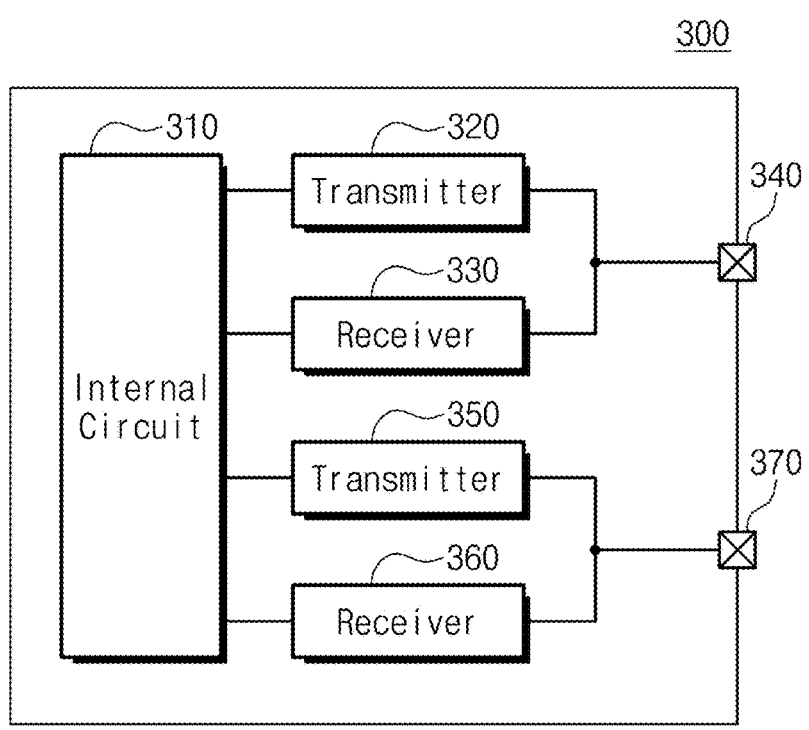
FIG. 11 illustrates an electronic device according to an additional embodiment of inventive concepts.

FIG. 11 illustrates an electronic device 300 according to an additional embodiment of inventive concepts. Referring to FIG. 11, the electronic device 300 may include an internal circuit 310, a first transmitter 320, a first receiver 330, a first pad 340, a second transmitter 350, a second receiver 360, and a second pad 370.

The internal circuit 310 may be configured to perform various operations used/designed for/intended in manufacturing and/or operation. For example, as described with reference to FIG. 1, the internal circuit 310 may provide the transmitters 320 and 350 with the current code IB and the bias voltage VB for controlling the transmitters 320 and 350. Additionally or alternatively, the internal circuit 310 may provide the transmitters 320 and 350 with the pull-up resistance code RPU, the pull-down resistance code RPD, and the first voltage V1 for controlling the transmitters 320 and 350.

The first transmitter 320 may output a signal to an external device through the first pad 340 under control of the internal circuit 310. The first transmitter 320 may include the transmitter 120 described with reference to FIG. 1. The first receiver 330 may transfer a signal received from the external device through the first pad 340 to the internal circuit 310.

The second transmitter 350 may output a signal to the external device through the second pad 370 under control of the internal circuit 310. The second transmitter 350 may include the transmitter 120 described with reference to FIG. 1. The second receiver 360 may transfer a signal received from the external device through the second pad 370 to the internal circuit 310. The second transmitter 350 may be the same as, e.g. identical in structure with, the first transmitter 320.

As illustrated in FIG. 11, the electronic device 300 may be configured to communicate with the external device through two or more pads. Each of the two or more pads may be connected with a corresponding transmitter and a corresponding receiver.

As described above, the level shifter 123 according to some example embodiments of inventive concepts may be included in the transmitter 120, 220, 320 or 350. The transmitter 120, 220, 320 or 350 including the level shifter 123 may be implemented as a portion of a transmission stage of a graphic double data rate (GDDR) synchronous dynamic random access memory (SDRAM) and/or a transmission stage of a GDDR physical block (PHY).

In the above example embodiments, components according to inventive concepts are described by using the terms "first", "second", "third", and the like. However, the terms "first", "second", "third", and the like may be used to distinguish components from each other and do not limit inventive concepts. For example, the terms "first", "second", "third", and the like do not necessarily involve an order or a numerical meaning of any form.

In the above example embodiments, components according to some example embodiments of inventive concepts are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Additionally or alternatively, the blocks may include circuits implemented with semiconductor elements in an integrated circuit or circuits enrolled as intellectual property (IP).

According to inventive concepts, when an input signal transitions from a high level to a low level and transitions from the low level to the high level, a level shifter may quickly/immediately apply a change of the input signal to an output signal by using the coupling. Accordingly, an electronic device including the level shifter having an improved operating speed may be provided.

While inventive concepts has been described with reference to exemplary embodiments thereof, it will be apparent to those of ordinary skill in the art that various changes and modifications may be made thereto without departing from the spirit and scope of inventive concepts as set forth in the following claims.

What is claimed is:

1. An electronic device comprising:
   an input node;
   an output node;
   a power node configured to pass a voltage at a third level to the output node in response to a voltage of the input node being at first level;
   a capacitor configured to adjust the voltage of the output node to a fourth level by coupling in response to the voltage of the input node changing from the first level to a second level; and
   a transistor connected between the output node and a current source, wherein
   a gate of the transistor is configured to be fixed to a power supply voltage.

2. The electronic device of claim 1, wherein the third level is greater than the first level, and the fourth level is greater than the second level.

3. The electronic device of claim 1, further comprising:
   a resistor connected between the power node and the output node; and
   the current source connected between the output node and the input node, and configured to pass a current through the resistor to adjust the voltage of the output node to the fourth level.

4. The electronic device of claim 3,
   wherein the transistor is configured to turn off in response to the voltage of the input node being the first level and is configured to turn on in response to the voltage of the input node being the second level.

5. The electronic device of claim 3, wherein the electronic device is configured to flow a current from the resistor to the output node in response to the input node being at the power supply voltage.

6. The electronic device of claim 3, wherein the electronic device is configured to flow a current from the resistor to the input node in response to the input node being at a supply voltage less than the power supply voltage.

7. The electronic device of claim 1, wherein, in response to the voltage of the input node changing from the second level to the first level, the capacitor is further configured to adjust the voltage of the output node to the third level by coupling.

8. The electronic device of claim 1, wherein the current source is configured to operate based on at least one of a bias voltage or a current code.

9. The electronic device of claim 1, wherein the transistor is configured to turn on in response to the input node being at a first voltage lower than the power supply voltage.

10. The electronic device of claim 1, wherein the transistor is configured to turn off in response to the input node being at the power supply voltage.

11. The electronic device of claim 1, wherein the transistor is configured to turn on in response to the input node being at a ground voltage.

12. The electronic device of claim 1, wherein the transistor is an NMOS transistor.

13. The electronic device of claim 1, wherein the output node is connected to a gate of a second transistor, the second transistor being a thin-oxide transistor.

14. The electronic device of claim 13, wherein an oxide thickness of the second transistor is between 1.5 nm and 4 nm.

15. The electronic device of claim 1, wherein the capacitor is a feed-forward capacitor.

16. The electronic device of claim 1, wherein a capacitance of the capacitor is ten or more times a parasitic capacitance associated with the output node.

* * * * *